United States Patent
Kobayakawa et al.

(10) Patent No.: US 8,431,949 B2
(45) Date of Patent: Apr. 30, 2013

(54) SEMICONDUCTOR LIGHT EMITTING DEVICE AND METHOD FOR MANUFACTURING THE SAME

(75) Inventors: Masahiko Kobayakawa, Kyoto (JP); Tomokazu Okazaki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 62 days.

(21) Appl. No.: 12/401,919

(22) Filed: Mar. 11, 2009

(65) Prior Publication Data
US 2009/0230424 A1    Sep. 17, 2009

(30) Foreign Application Priority Data

Mar. 11, 2008   (JP) .................................. 2008-61218
Feb. 23, 2009   (JP) .................................. 2009-38964

(51) Int. Cl.
*H01L 33/52* (2010.01)
(52) U.S. Cl.
USPC .............. 257/99; 257/E33.062; 257/E33.065
(58) Field of Classification Search .................... 257/98, 257/99, 100, E33.056, E33.057, E33.058, 257/E33.059, E33.062, E33.065
See application file for complete search history.

(56) References Cited

U.S. PATENT DOCUMENTS

| | | | | |
|---|---|---|---|---|
| 3,914,786 A * | 10/1975 | Grossi | ............................. | 257/98 |
| 5,294,897 A * | 3/1994 | Notani et al. | .................... | 333/33 |
| 6,061,160 A * | 5/2000 | Maruyama | .................... | 398/201 |
| D432,095 S * | 10/2000 | Seeger et al. | ................. | D13/182 |
| 6,495,860 B1 * | 12/2002 | Yu | .................................... | 257/99 |
| 6,521,916 B2 * | 2/2003 | Roberts et al. | ................. | 257/100 |
| 6,525,386 B1 * | 2/2003 | Mills et al. | ..................... | 257/433 |
| 6,573,580 B2 * | 6/2003 | Arndt | ............................. | 257/433 |
| 6,710,373 B2 * | 3/2004 | Wang | ............................. | 257/79 |
| 6,717,256 B1 * | 4/2004 | Suzuki et al. | .................. | 257/691 |
| 6,806,506 B2 * | 10/2004 | Tsuji | ............................... | 257/99 |
| 7,282,785 B2 * | 10/2007 | Yoshida | ........................ | 257/666 |
| 7,420,271 B2 * | 9/2008 | Hsu | ................................ | 257/695 |
| D587,221 S * | 2/2009 | Tokuda | ........................ | D13/180 |
| 2003/0107316 A1 * | 6/2003 | Murakami et al. | ............ | 313/512 |
| 2003/0168670 A1 * | 9/2003 | Roberts et al. | .................. | 257/98 |
| 2008/0012036 A1 * | 1/2008 | Loh et al. | ......................... | 257/99 |

FOREIGN PATENT DOCUMENTS

JP   2003-188418   7/2003

* cited by examiner

*Primary Examiner* — Eduardo A Rodela
(74) *Attorney, Agent, or Firm* — Hamre, Schumann, Mueller & Larson, P.C.

(57) ABSTRACT

A light emitting device includes a semiconductor light emitting element, a first lead including an element mount portion on which the semiconductor light emitting element is mounted, and a second lead electrically connected to the semiconductor light emitting element. The light emitting device further includes a resin package covering the semiconductor light emitting element and part of each of the first and the second leads. The resin package includes a lens portion facing the semiconductor light emitting element. The first lead includes a pair of standing portions spaced from each other with the element mount portion intervening between them and a pair of terminal portions extending from the standing portions in mutually opposite directions. Each of the standing portions projects from the resin package in a direction away from the lens portion.

5 Claims, 8 Drawing Sheets

US 8,431,949 B2

SEMICONDUCTOR LIGHT EMITTING DEVICE AND METHOD FOR MANUFACTURING THE SAME

BACKGROUND OF THE INVENTION

1. Field of the Invention

The present invention relates to a light emitting device including a semiconductor light emitting element as the light source. The present invention also relates to a method for manufacturing such a light emitting device.

2. Description of the Related Art

FIG. 9 shows an example of semiconductor light emitting device (see e.g. JP-A-2003-188418). The light emitting device X shown in the figure includes a first lead 91A, a second lead 91B, an LED chip 92 and a resin package 93. The LED chip 92 is mounted on the first lead 91A and connected to the second lead 91B via a wire. The resin package 93 is formed with a lens portion 93*a* having an optical axis L. Each of the leads 91A and 91B includes a portion exposed outside the resin package 93, and the exposed portion provides a terminal 91Aa or 91Ba for external connection. The light emitting device X is fixed to a substrate B via solder S, with the terminals 91Aa and 91Ba penetrating through the substrate B.

The light emitting device X still has room for improvement on e.g. the following points. That is, it is desirable that the light emitting device has a structure that makes it possible to set the optical axis L precisely relative to the substrate B in mounting the light emitting device X to the substrate B or after the mounting. Moreover, it is desirable that the light emitting device has a structure capable of responding to the demand for size reduction.

SUMMARY OF THE INVENTION

According to a first aspect of the present invention, there is provided a light emitting device comprising a semiconductor light emitting element, a first lead including an element mount portion on which the semiconductor light emitting element is mounted, a second lead electrically connected to the semiconductor light emitting element, and a resin package covering the semiconductor light emitting element and part of each of the first and the second leads. The resin package includes a lens portion facing the semiconductor light emitting element. The first lead includes a pair of standing portions spaced from each other with the element mount portion intervening between them and a pair of terminal portions extending from the paired standing portions in mutually opposite directions. Each of the standing portions projects from the resin package in a direction away from the lens portion.

Preferably, the second lead includes a pad on which a wire is to be bonded, a pair of standing portions spaced from each other with the pad intervening between them and a pair of terminal portions extending from the paired standing portions in mutually opposite directions. Each of the standing portions projects from the resin package in a direction away from the lens portion.

Preferably, the paired standing portions of at least one of the first and the second leads is designed to increase the distance between them as proceeding away from the lens portion.

Preferably, one of the terminal portions of the first and the second leads is different in width from the other three terminal portions.

According to a second aspect of the present invention, there is provided a method for manufacturing a light emitting device. In this method, a predetermined lead frame is used. The lead frame includes a pair of frame bases and a first and a second leads provided between the frame bases. The paired frame bases are spaced from each other in a first direction, and the first and the second leads extend in the first direction and are spaced from each other in a second direction. Each of the leads includes a pad at the center. After the lead frame is prepared, the first and the second leads are so bent that the respective pads of the first and the second leads are translated in a third direction that is perpendicular to both of the first and the second directions. Then, a semiconductor light emitting element is mounted on the pad of the first lead, and the semiconductor light emitting element and the pad of the second lead are connected to each other via a wire. Then, a resin package is formed to cover part of the first lead, part of the second lead, and the semiconductor light emitting element.

Other features and advantages of the present invention will become more apparent from the detailed description given below with reference to the accompanying drawings.

DETAILED DESCRIPTION OF THE PREFERRED EMBODIMENTS

Preferred embodiments of the present invention will be described below with reference to the accompanying drawings.

Figure 1:
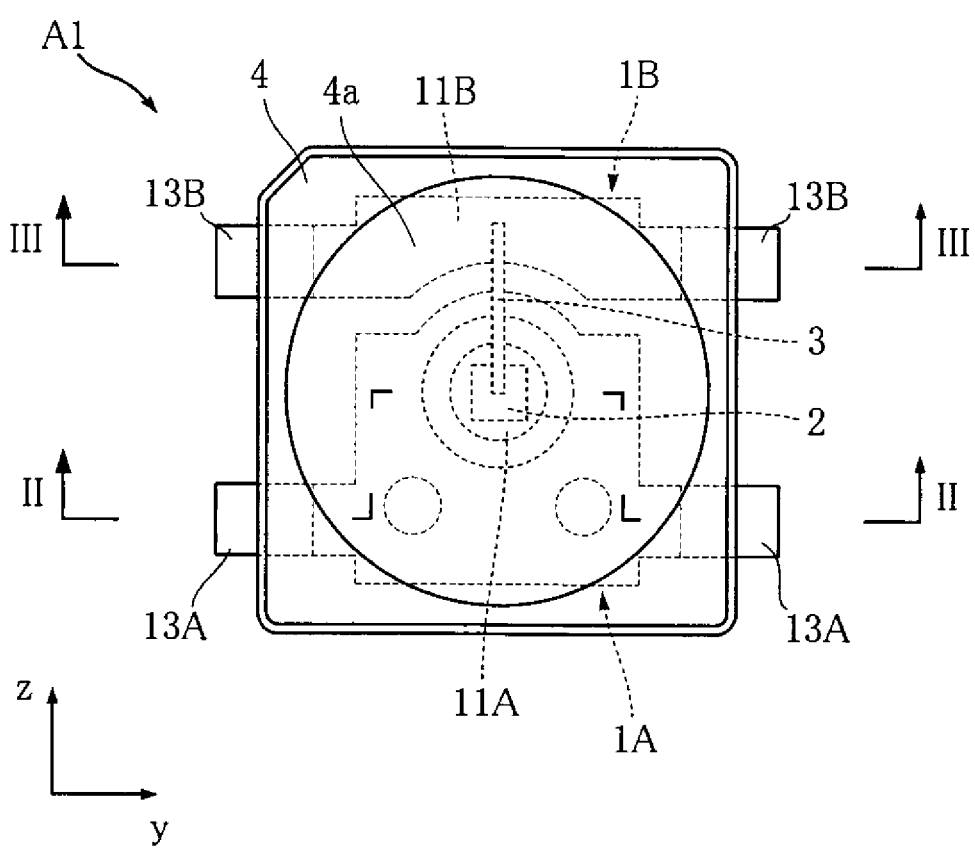
FIG. 1 is a plan view showing a semiconductor light emitting device according to a first embodiment of the present invention.
Figure 2:
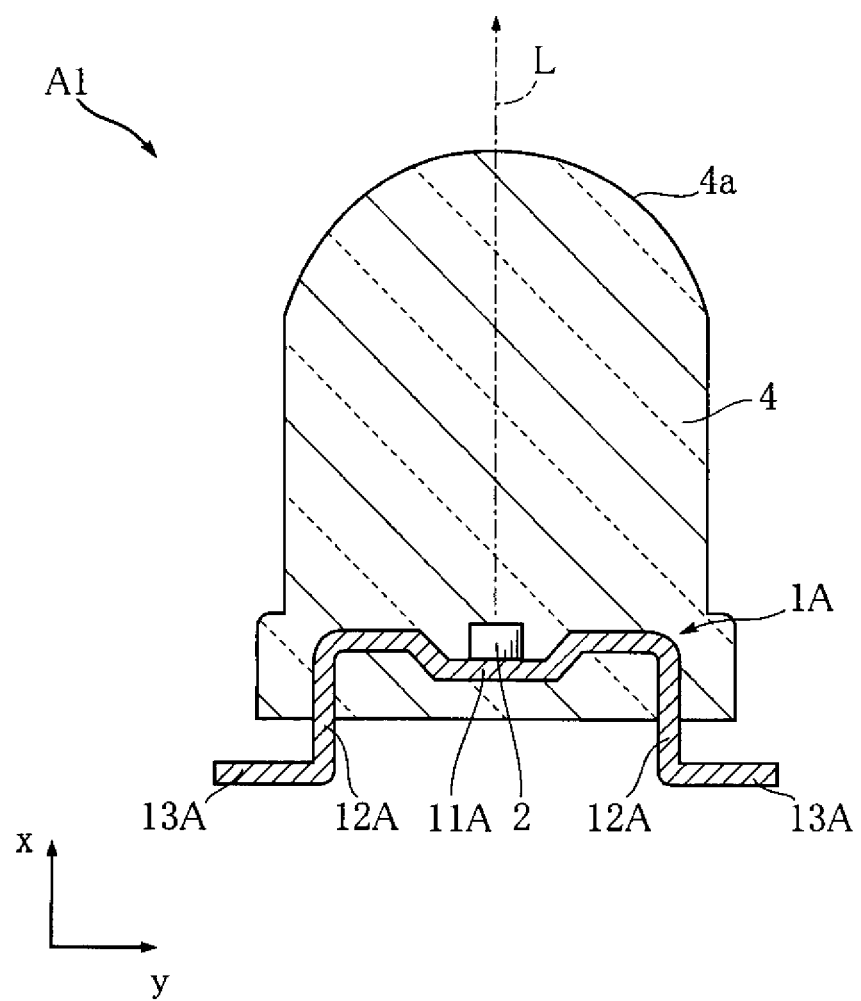
FIG. 2 is a sectional view taken along lines II-II in FIG. 1.
Figure 3:
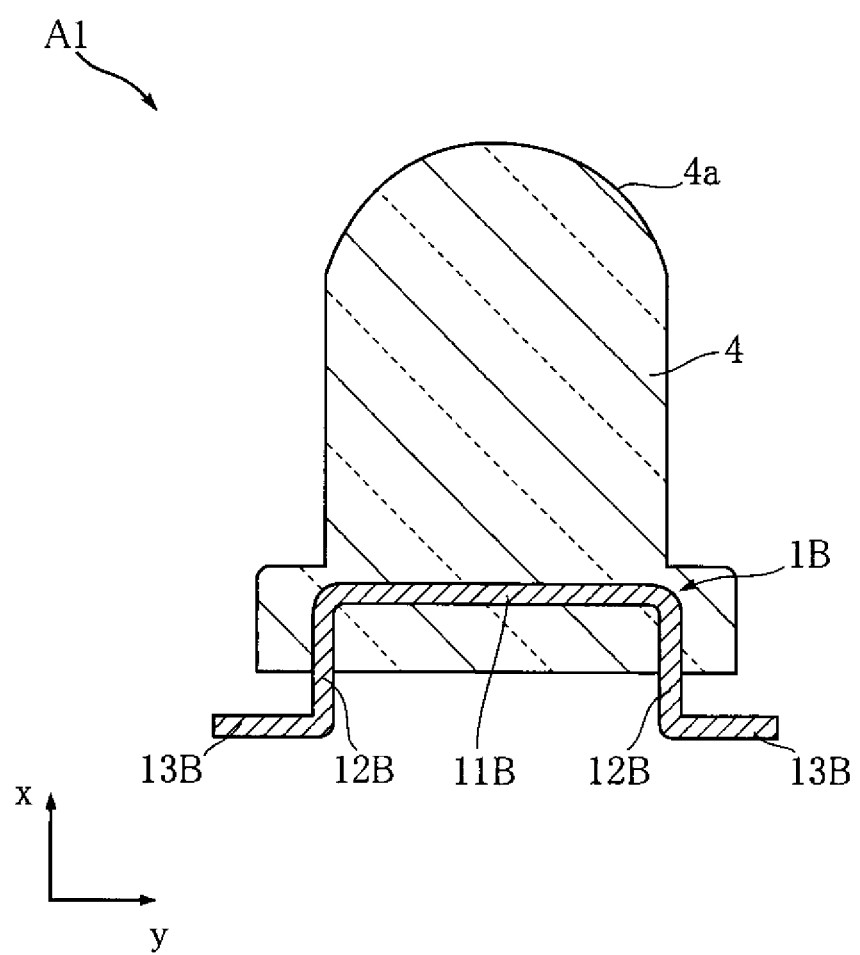
FIG. 3 is a sectional view taken along lines III-III in FIG. 1.

FIGS. 1-3 show a semiconductor light emitting device according to a first embodiment of the present invention. The illustrated light emitting device A1 includes a first lead 1A, a second lead 1B, an LED chip (semiconductor light emitting element) 2, and a resin package 4.

The first and the second leads 1A and 1B are made of e.g. a Cu alloy and used for the mounting of the light emitting device A1 to a circuit board and the power supply to the LED chip 2. As shown in FIGS. 2 and 3, each of the leads 1A and 1B is partially covered by the resin package 4.

As shown in FIG. 2, the first lead 1A includes a pair of standing portions 12A, a chip mount portion positioned between the standing portions, and a pair of terminal portions 13A. The chip mount portion is formed with a pad 11A on which the LED chip 2 is die-bonded. As shown in FIG. 2, the pad 11A may be in the form of a cup having a diameter which increases as proceeding upward. The paired standing portions 12A are spaced from each other in the y direction, with the chip mount portion intervening between them. Each of the standing portions 12A projects from the resin package 4 downward in the x direction, i.e., in the direction away from the lens portion 4a (which will be described later). Each of the paired terminal portions 13A is connected to the lower end of a respective one of the standing portions 12A. The terminal portions 13A extend away from each other in the y direction.

As shown in FIG. 3, the second lead 1B includes a pad 11B, a pair of standing portions 12B and a pair of terminal portions 13B. As shown in FIG. 1, a wire 3 is bonded to the pad 11. The paired standing portions 12B are spaced from each other in the y direction, with the pad 11B intervening between them and project from the resin package 4 downward in the x direction. Each of the paired terminal portions 13B is connected to the lower end of a respective one of the standing portions 12B. The terminal portions 13B extend away from each other in the y direction. As shown in FIG. 1, the right terminal 13B of the second lead 13 and the right terminal 13A of the first lead 1A are spaced from each other in the z direction and extend in parallel to each other in the y direction. Similarly, the left terminal 13B of the second lead 1B and the left terminal 13A of the first lead 1A are spaced from each other in the z direction and extend in parallel to each other in the y direction.

The LED chip 2 is the light source of the light emitting device A1 and e.g. a semiconductor light emitting element including an n-type semiconductor layer, a p-type semiconductor layer and an active layer sandwiched between these layers. The LED chip 2 is die-bonded to the bottom surface of the above-described cup-shaped pad 11A. An electrode is provided on the upper surface of the LED chip 2, and the electrode is electrically connected to the lead 1B via the wire 3.

The resin package 4 covers the entirety of the LED chip 2 and part of each lead 1A, 1B. The resin package 4 is designed to transmit the light from the LED chip 2 and made of e.g. an epoxy resin or a silicone resin. The resin package 4 is formed with a lens portion 4a at the upper portion. The lens 4a faces the LED chip 2 and has an optical axis L extending in the x direction. The lens 4a has a function to converge the light emitted from the LED chip 2. As will be understood from FIGS. 2 and 3, the resin package 4 includes a flat bottom surface positioned on the opposite side of the lens portion 4a. The standing portions of the leads 1A and 1B project from the bottom surface to extend downward. The terminal portions 13A and 13B of the leads 1A and 1B extend in parallel to the bottom surface of the resin package 4.

An example of a method for manufacturing the light emitting device A1 will be described below with reference to FIGS. 4 and 5.

Figure 4:
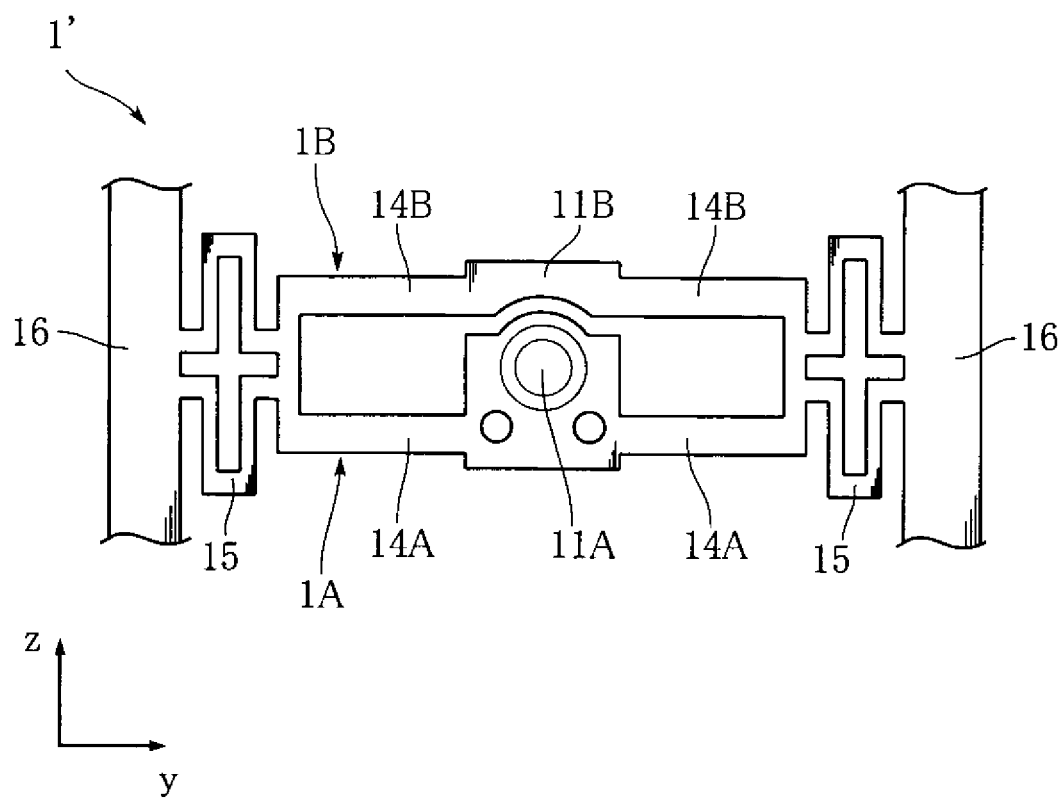
FIG. 4 is a plan view showing a principal portion of a lead frame used for manufacturing the light emitting device shown in FIG. 1.

First, a lead frame 1' as shown in FIG. 4 is prepared. The lead frame 1' includes a pair of frame bases 16 extending in parallel to each other (at least partially) and a pair of leads 1A and 1B. The two leads 1A and 1B are connected to the frame bases 16 via a pair of easily deformable portions 15. In the example shown in FIG. 4, each of the easily deformable portions 15 comprises a pair of crank-shaped members and is symmetrical in the vertical direction and the horizontal direction. As will be described below, each of the easily deformable portions 15 is structured to easily yield to a pulling force in the horizontal direction (y direction).

Although only a single pair of leads 1 and 1B is shown in FIG. 4, the present invention is not limited to this structure.

For instance, use may be made of a lead frame which includes a plurality of pairs of leads 1A and 1B arranged in a row or matrix.

The leads 1A and 1B extend in the y direction (the direction in which the two frame bases 16 are spaced from each other) and are spaced from each other in the z direction (longitudinal direction of each frame base 16) The lead 1A includes a rectangular conductive portion (chip mount portion) and a pair of strip portions 14A extending from the conductive portion. The rectangular conductive portion is formed with a cup-shaped pad 11A. The lead 1B includes a pad 11B and a pair of strip portions 14B extending from the pad 11B. Each of the pads 11A and 11B is located at an equal distance (or substantially equal distance) from the right and left frame bases 16. The length of the conductive portion of the first lead 1A (dimension measured in the y direction) is equal to the length of the pad 11B of the second lead 1B.

Figure 5:
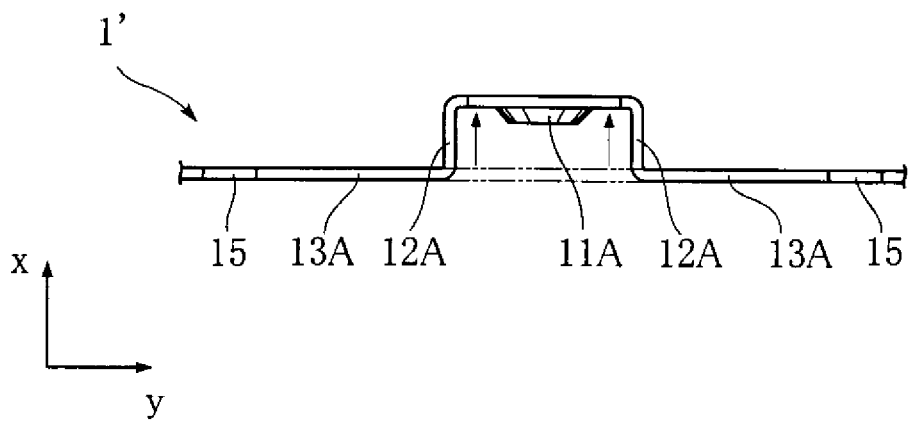
FIG. 5 is a side view showing the step of bending the lead frame of FIG. 4.

Then, as shown in FIG. 5, bending is performed simultaneously with respect to the two leads 1A and 1B. Specifically, the rectangular conductive portion of the lead 1A and the pad 11B of the lead 1B are simultaneously pushed up from below by a predetermined distance using e.g. a pressing machine including a predetermined mold. By this process, the rectangular conductive portion (and hence the pad 11A) and the pad 11B are translated in the x direction, and the nearby portions connected to these portions stand (see the reference sign 12A in FIG. 5). In this process, the remaining portion of each lead is slidably held by e.g. a pressing portion of the pressing machine so that the remaining portion is kept horizontal. As a result, each strip portion 14A, 14B is bent at a right angle at two locations to be shaped like a crank. In this way, the standing portions 12A, 12B and the terminal portions 13A, 13B extending horizontally from the lower ends of the standing portions are formed. The length of each terminal portion 13A, 13B is adjustable by the frame cutting operation, which is performed after the bending (more precisely, after the formation of a resin package).

In the above-described bending process, a force to pull the two frame bases 16 toward each other is produced. However, this force is consumed in stretching each of the paired easily deformable portions 15 in the y direction. Thus, the frame bases 16 are prevented from being unduly distorted. The technique described above is merely an example, and the leads 1A and 1B may be bent by a technique different from the above.

After the bending, an LED chip 2 is die-bonded to the pad 11A. Thereafter, a wire 3 is bonded to the LED chip 2 and the pad 11B, and then, a resin package 4 is formed. In this way, the light emitting device A1 shown in FIGS. 1-3 is obtained.

The advantages of the light emitting device A1 and the manufacturing method will be described below.

According to the first embodiment, the chip mount portion (and hence the LED chip 2 mounted on this portion) and the resin package 4 are supported by the paired standing portions 12A and the paired terminal portions 13A. As shown in FIG. 2, the right and left standing portions 12A are spaced from each other in the y direction, with the pad 11A intervening between them. (This arrangement holds true for the right and left terminal portions 13A.) This arrangement is suitable for positioning the chip mount portion (hence the LED chip 2) and the resin package 4 precisely and stably relative to a circuit board. Further, with the provision of the lead 1B, which is bent similarly to the lead 1A, the mounting angle of the light emitting device A1 around the y direction can be set and maintained properly.

In the above-described manufacturing method, the resin package 4 is formed after the bending of the leads is finished.

Thus, in forming the resin package 4, the work is not obstructed by the tools for bending such as a mold, so that the variety of possible design of the resin package 4 is wide. Thus, it is possible to set the projecting amount of the standing portions 12A and 12B from the resin package 4 to a desirable value, which ensures reduction in the dimension of the light emitting device A1 in the x direction.

Other embodiments of the present invention will be described below with reference to FIGS. 6-8. In these figures, the elements which are identical or similar to those of the first embodiment are designated by the same reference signs as those used for the first embodiment.

Figure 6:
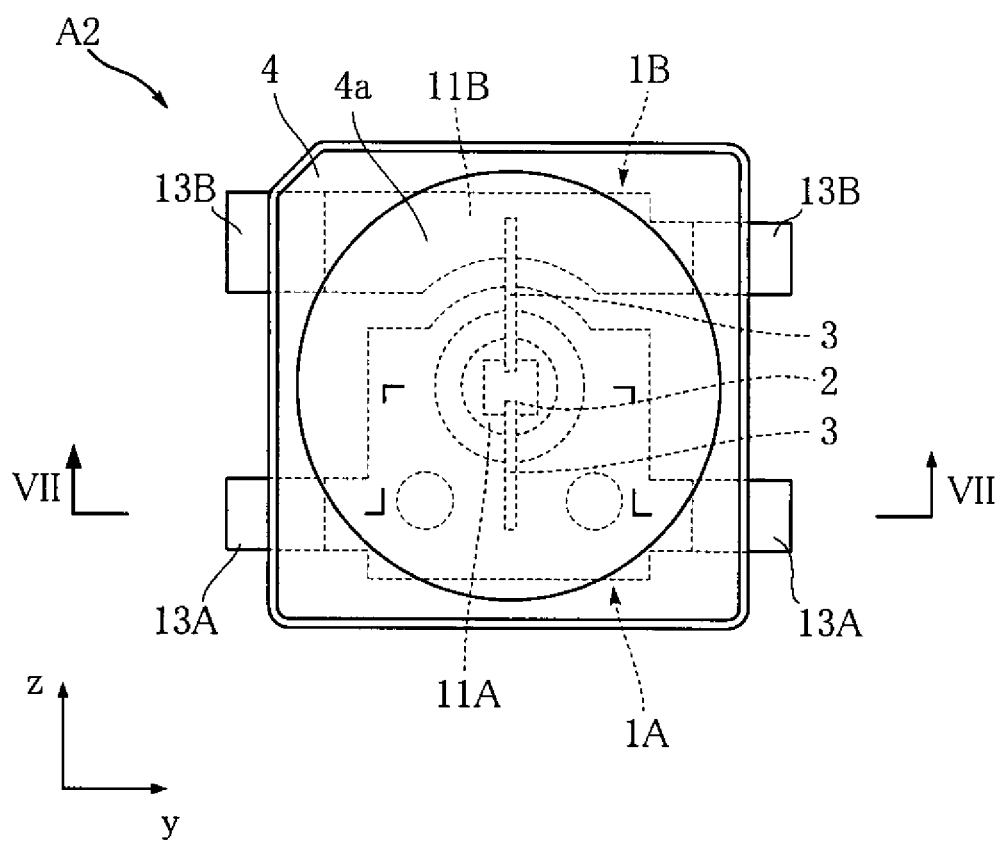
FIG. 6 is a plan view showing a semiconductor light emitting device according to a second embodiment of the present invention.
Figure 7:
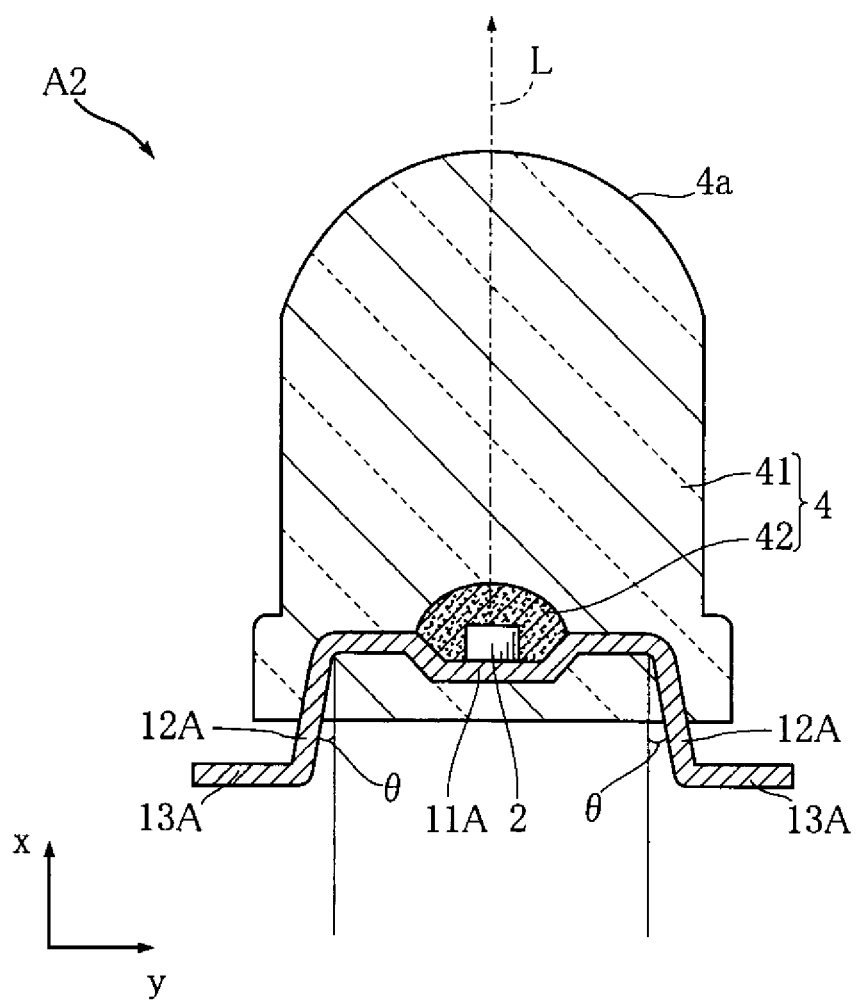
FIG. 7 is a sectional view taken along lines VII-VII in FIG. 6.

FIGS. 6 and 7 show a semiconductor light emitting device according to a second embodiment of the present invention. The illustrated light emitting device A2 differs from the light emitting device A1 of the first embodiment in structure of the terminal portions 13B, standing portions 12A, 12B and resin package 4.

As shown in FIG. 6, in the second embodiment, one of the terminal portions 13B (the left one in FIG. 6) of the second lead 1B is wider than the other one of the terminal portions 13B (the right one). The width of the right terminal portion 13B of the second lead 1B is equal to that of the two terminal portions 13A of the first lead 1A. That is, one of the four terminal portions 13A, 13B is wider than the other three terminal portions. Instead of this, one terminal portion may be made narrower than the other three terminal portions. These arrangements make it easier to recognize the polarity of the light emitting device A2.

As shown in FIG. 7, the paired standing portions 12A of the first lead 1A are so inclined as to increase the distance between them as proceeding from the upper side toward the lower side (as proceeding away from the lens portion 4a). The angle of inclination θ of each standing portion 12A with respect to the vertical direction is e.g. about 10 degrees. The paired standing portions 12B of the second lead 1B have a similar structure. The arrangement in which the standing portions 12A, 12B are inclined is achieved more easily than the arrangement in which the standing portions are parallel (see FIGS. 2 and 3). To obtain this advantage, it is preferable to select the angle of inclination θ of each standing portion 12A, 12B from the range of e.g. 5 to 15 degrees.

As shown in FIG. 6, two wires 3 are bonded to the LED chip 2. The LED chip 2 of the second embodiment is of the type which includes two electrodes on one surface (e.g. the upper surface in FIG. 7). The wires 3 are bonded to the respective electrodes. The LED chip 2 is designed to emit e.g. blue light.

The resin package 4 comprises a transparent resin portion 41 and a fluorescent resin portion 42 covered by the transparent resin portion 41. The transparent resin portion 41 is made of a material which is identical or similar to that of the resin package 4 of the first embodiment. The fluorescent resin portion 42 directly covers the upper surface of the LED chip 2 and the pad 11A and is made of a material obtained by mixing a fluorescent substance into a transparent resin. The fluorescent substance emits yellow light when excited by e.g. blue light. Thus, the blue light from the LED chip 2 and the yellow light from the fluorescent resin portion 42 overlap each other to produce white light, and the white light is emitted from the lens portion 4a of the resin package 4. As the fluorescent substance, instead of a substance that emits blue light, use may be made of a mixture of two fluorescent substances (e.g. a substance which emits red light and a substance which emits green light) The fluorescent resin portion 42 may be formed by dropping a resin material in a liquid state mixed with a fluorescent substance from above the LED chip 2 and hardening the resin material.

Figure 8:
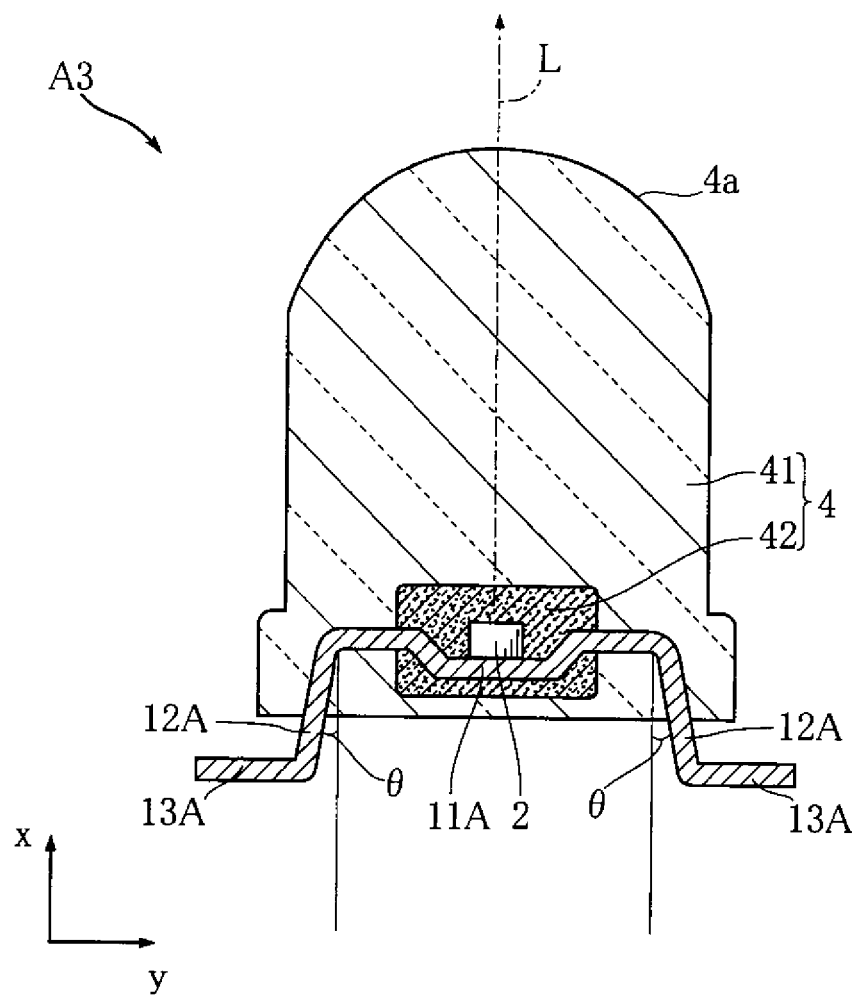
FIG. 8 is a plan view showing a semiconductor light emitting device according to a third embodiment of the present invention.
Figure 9:
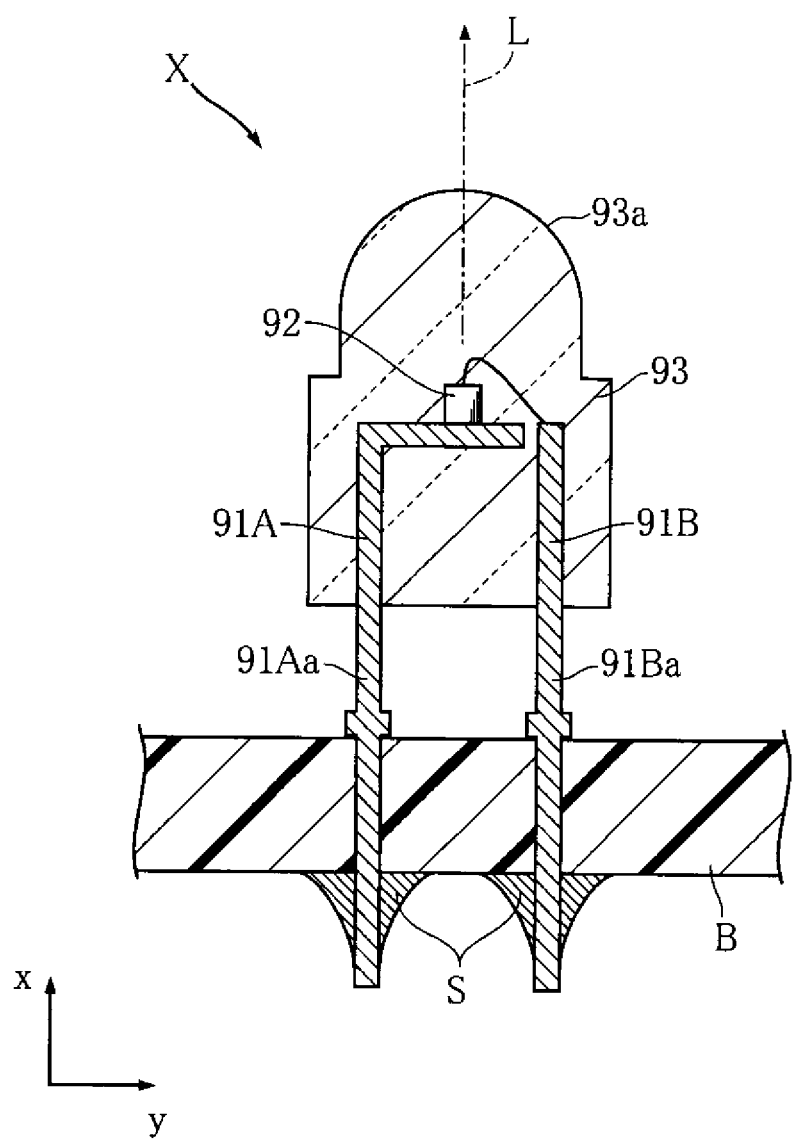
FIG. 9 is a sectional view showing an example of conventional semiconductor light emitting device.

FIG. 8 shows a semiconductor light emitting device according to a third embodiment of the present invention. The illustrated light emitting device A3 differs from the light emitting device A2 of the second embodiment in shape of the fluorescent resin portion 42. Specifically, in the third embodiment, the fluorescent resin portion 42 covers not only the upper surface of the LED chip 2 and the pad 11A but also the reverse surface of the pad 11A. This fluorescent resin portion 42 may be formed by molding.

The invention claimed is:

1. A light emitting device, comprising:
a semiconductor light emitting element;
a first lead including an element mount portion on which the semiconductor light emitting element is mounted;
a second lead electrically connected to the semiconductor light emitting element; and
a resin package covering the semiconductor light emitting element and part of each of the first and the second leads, the resin package including a lens portion facing the semiconductor light emitting element and a bottom surface opposite to the lens portion;
wherein the first lead includes a pair of first standing portions and a pair of first terminal portions, the first standing portions being spaced from each other with the element mount portion intervening therebetween, the first terminal portions extending from the first standing portions in opposite directions and in a direction in which the first standing portions are spaced from each other, and wherein each of the first standing portions projects from the bottom surface of the resin package in a direction away from the lens portion, and each of the first terminal portions is spaced apart from the bottom surface of the resin package and extends in parallel to the bottom surface of the resin package,
wherein the second lead includes a pair of second standing portions and a pair of second terminal portions, the second terminal portions extending from the second standing portions in opposite directions, each of the second standing portions projecting from the bottom surface of the resin package in a direction away from the lens portion, each of the second terminal portions extending in parallel to the bottom surface of the resin package,
wherein the first terminals and the second terminal portions are flush with each other so as to extend along and in contact with a common plane, and
wherein one of the first terminal portions and the second terminal portions is different in width from the other three terminal portions.

2. The light emitting device according to claim 1, wherein the second lead includes a pad for bonding a wire, the pad being disposed between the second standing portions.

3. The light emitting device according to claim 2, wherein the standing portions of at least one of the first and the second leads is designed to increase a distance therebetween as proceeding away from the lens portion.

4. The light emitting device according to claim 1, wherein the element mount portion is formed with a recess in which the semiconductor light emitting element is provided.

5. The light emitting device according to claim 1, wherein the pair of standing portions are integrally connected to the element mount portion.

* * * * *